US009142694B2

(12) United States Patent
Gerber et al.

(10) Patent No.: US 9,142,694 B2
(45) Date of Patent: Sep. 22, 2015

(54) FOCAL PLANE ARRAY PACKAGING USING ISOSTATIC PRESSURE PROCESSING

(71) Applicant: Raytheon Company, Waltham, MA (US)

(72) Inventors: Kenneth Allen Gerber, Santa Maria, CA (US); Jonathan Getty, Goleta, CA (US); Aaron M. Ramirez, Santa Barbara, CA (US); Scott S. Miller, Lompoc, CA (US)

(73) Assignee: Raytheon Company, Waltham, MA (US)

( * ) Notice: Subject to any disclaimer, the term of this patent is extended or adjusted under 35 U.S.C. 154(b) by 52 days.

(21) Appl. No.: 14/093,728

(22) Filed: Dec. 2, 2013

(65) Prior Publication Data
US 2015/0118784 A1 Apr. 30, 2015

Related U.S. Application Data

(60) Provisional application No. 61/895,693, filed on Oct. 25, 2013.

(51) Int. Cl.
*H01L 31/0203* (2014.01)
*H01L 27/144* (2006.01)
*H01L 23/00* (2006.01)
*H01L 27/146* (2006.01)

(52) U.S. Cl.
CPC ............ *H01L 31/0203* (2013.01); *H01L 24/26* (2013.01); *H01L 24/75* (2013.01); *H01L 24/81* (2013.01); *H01L 24/83* (2013.01); *H01L 27/144* (2013.01); *H01L 27/1465* (2013.01); *H01L 27/1469* (2013.01); *H01L 27/14634* (2013.01); *H01L 2224/16145* (2013.01); *H01L 2224/75101* (2013.01); *H01L 2224/8182* (2013.01);

(Continued)

(58) Field of Classification Search
CPC .................................................. H01L 21/0203
See application file for complete search history.

(56) References Cited

U.S. PATENT DOCUMENTS

RE42,542 E * 7/2011 Palanisamy ................... 438/106
2003/0148596 A1 8/2003 Kellar et al.
2007/0231952 A1* 10/2007 Frutschy et al. .............. 438/106

(Continued)

OTHER PUBLICATIONS

Notification of Transmittal of the International Search Report and Written Opinion of the International Searching Authority, or the Declaration, PCT/US2014/058539, Jan. 23, 2015, 1 page.

(Continued)

*Primary Examiner* — Angel Roman
(74) *Attorney, Agent, or Firm* — Daly, Crowley, Mofford & Durkee, LLP

(57) ABSTRACT

A method for bonding a first semiconductor body having a plurality of electromagnetic radiation detectors to a second semiconductor body having read out integrated circuits for the detectors. The method includes: aligning electrical contacts for the plurality of electromagnetic radiation detectors with electrical contacts of the read out integrated circuits; tacking the aligned electrical contacts for the plurality of electromagnetic radiation detectors with electrical contacts of the read out integrated circuits to form an intermediate stage structure; packaging the intermediate stage structure into a vacuum sealed electrostatic shielding container having flexible walls; inserting the package with the intermediate stage structure therein into an isostatic pressure chamber; and applying the isostatic pressure to the intermediate stage structure through walls of the container. The container includes a stand-off to space walls of the container from edges of the first semiconductor body.

29 Claims, 10 Drawing Sheets

(52) U.S. Cl.
CPC ................ *H01L2224/81193* (2013.01); *H01L 2224/81209* (2013.01)

(56) References Cited

U.S. PATENT DOCUMENTS

2010/0171097 A1* 7/2010 Nagai et al. .................... 257/21
2011/0111560 A1* 5/2011 Purushothaman et al. ... 438/109

OTHER PUBLICATIONS

International Search Report, PCT/US2014/058539, Jan. 23, 2015, 4 pages.
Written Opinion of the International Searching Authority, PCT/US2014/058539, Jan. 23, 2015, 16 pages.

* cited by examiner

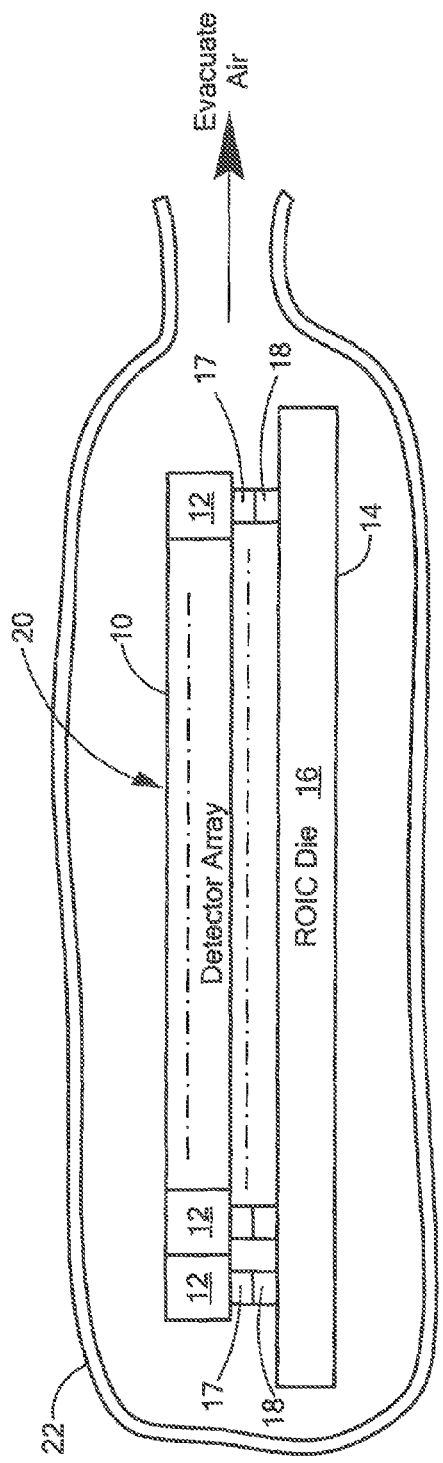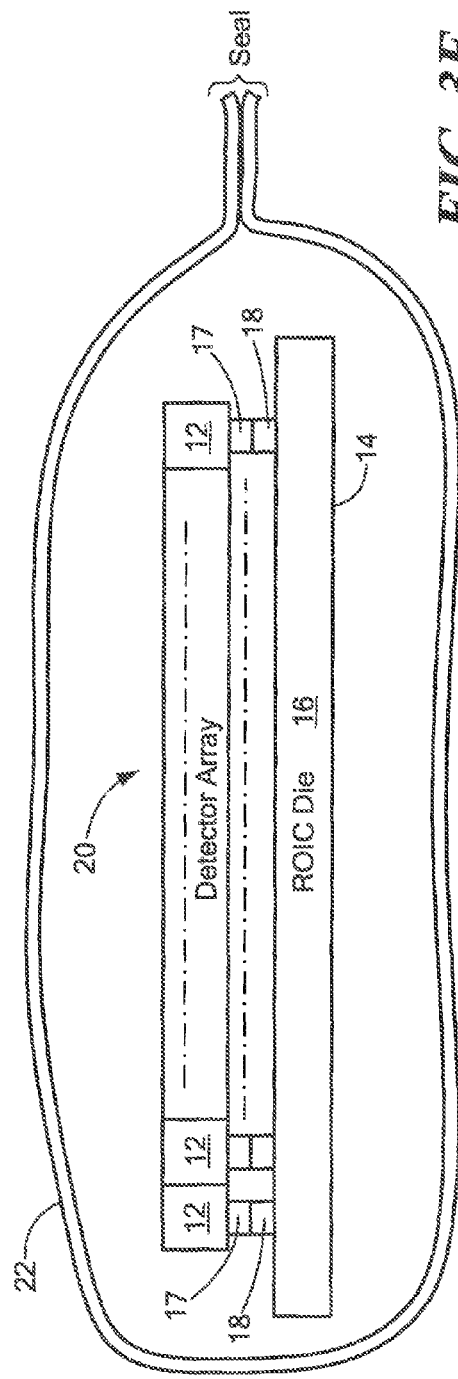

FOCAL PLANE ARRAY PACKAGING USING ISOSTATIC PRESSURE PROCESSING

CROSS REFERENCE TO RELATED APPLICATION

This application claims the benefit of U.S. Provisional Patent Application No. 61/895,693 filed. Oct. 25, 2013 under 35 U.S.C. §1.19(e) which application is hereby incorporated herein by reference in its entirety.

TECHNICAL FIELD

This disclosure relates generally to focal plane arrays and more particularly to packaging of such focal plane arrays.

BACKGROUND

As is known in the art, one type of focal plane array includes a semiconductor wafer having an array of electromagnetic radiation detectors, such as infrared detectors or optical energy detectors, flip chip bonded to a semiconductors wafer having read out integrated circuit (ROIC) electronics for processing the energy detected by the detectors.

More particularly, with a cold (i.e., room temperature) compression bonding technique, a flip chip single die to die bonding process is used consisting of two steps: alignment of the two wafers, followed by a cold compression pressing illustrated in FIG. 1, which forms the mechanical and electrical interconnect. More particularly, a solid chuck (FIG. 1) presses the aligned parts (i.e., the detector die to the ROIC die) together; however, because the semiconductor wafer having an array of electromagnetic radiation detectors is not perfectly flat, (i.e., non-uniform), applying pressure at the high points (i.e., stress points indicated by the stars in FIG. 1) of the back of the detector wafer or thicker sections of the hybrid stack results in areas where interconnection is not achieved until stack is sufficiently deformed to allow low areas (thinner substrate) the chance to achieve interconnection, For large die, the long bonding time and the tight flatness requirement results in higher cost due to increased time on the precision aligner and more stringent requirements on the flatness of incoming detector die and readout Integrated Circuits (ROIC) die/components.

In standard reflow flip-chip bonding, the die are aligned and the electrical contacts of the detectors and the elements of the ROIC are vertically stacked; then the contacts are melted together to form a bond. This method is difficult in Infrared (IR) Sensor Chip Assembly (SCA) hybridization due to mismatches in coefficient of thermal expansion between detector and ROIC materials and ever decreasing pixel pitches.

An interconnect approach using oxide and/or metallic bonding to connect multiple die to a wafer may be used; however, these process are difficult to integrate with many Infrared detector materials.

Thus, in summary: (1) the use of flip chip cold compression bonding requires a very flat die which decreases yield of incoming components and increases cost; is relatively time intensive; requires significant amount of time on high precision (expensive) aligner; and is limited to single die hybridization which limits throughput and potential cost savings from batch processing; (2) reflow bonding, high throughput wafer level solutions rely on solder bonding at elevated temperatures and the higher temperature processing is not compatible with most IR materials due to mismatch in coefficient of thermal expansion and fine pixel pitch spacing; also reflow bonding requires very flat die which decreases yield of incoming components and increases cost; and (3) Oxide and/or metallic bonding techniques are not compatible with IR materials, particularly column III-V materials, due to material incompatibility with high temperatures and would require very flat die/wafers which decrease yield of incoming components and wafer cost.

SUMMARY

In accordance with the disclosure, a method is proved for bonding a first semiconductor body having a plurality of electromagnetic radiation detectors to a second semiconductor body having read out integrated circuits for the detectors. The method includes: aligning the first and second semiconductor bodies one over the other to form an intermediate stage structure; and applying isostatic pressure to the intermediate stage structure.

In one embodiment, the method includes: packaging the intermediate stage structure into a container having flexible walls; inserting the package with the intermediate stage structure therein into a pressure chamber; and applying the isostatic pressure to the intermediate stage structure through the walls of the container.

In one embodiment, the container provides electrostatic shielding to the intermediate stage structure.

In one embodiment, the container includes a stand-off to space walls of the container from edges of the first semiconductor body.

In one embodiment, a method is provided for bonding a first semiconductor body having a plurality of electromagnetic radiation detectors to a second semiconductor body having read out integrated circuits for the detectors. The method includes: aligning electrical contacts for the plurality of electromagnetic radiation detectors with electrical contacts of the read out integrated circuits; tacking the aligned electrical contacts for the plurality of electromagnetic radiation detectors with electrical contacts of the read out integrated circuits to form an intermediate stage structure; packaging the intermediate stage structure into a vacuum sealed container having flexible walls; inserting the package with the intermediate stage structure therein into a pressure chamber; and applying the pressure to the intermediate stage structure through walls of the container.

In one embodiment the pressure is an isostatic pressure.

In one embodiment, the first semiconductor body includes first semiconductor wafer has a plurality of semiconductor die each die having a plurality of electromagnetic radiation detectors and the second semiconductor body includes a plurality of semiconductor die each die having read out integrated circuits for a corresponding one of the die of the plurality of electromagnetic radiation detectors.

In another embodiment, first semiconductor body is a semiconductor die having a plurality of electromagnetic radiation detectors and the second semiconductor body is a semiconductor die having read out integrated circuits.

With such methods, the tacking is performed using a rapid compression (e.g. <10 minutes, compared to 1-2 hours). Once multiple die are tacked, or partially hybridized, the wafer (or section) is loaded into a vacuum-sealed container, e.g., bag. A fixture may or may not be used to hold the wafer. The wafer and bag are exposed to the isostatic pressure process that compresses all surfaces of the bag with a high-pressure gas or liquid. The isostatic compression finishes the hybridization, achieving hybrid gap uniformity that would otherwise require a longer primary hybridization process.

Applying isostatic compression to batch hybridization enables a shorter overall process cycle time because the primary hybrid process time is reduced, and all die are finished simultaneously the isostatic press. Cycle time reduction reduces difficulties caused by the passage of time in a die-to-wafer process, e.g. where indium interconnects are used for the array of read out integrated circuits, oxidation of prepared surfaces where particles land on the exposed indium, etc. The isostatic process also reduces the hybrid gap non-uniformity observed with rapid primary hybridization. Finally, an isostatic press is much cheaper than a hybridizer, allowing greater throughput with a fixed cost of capital equipment. A side effect of this process is that by enabling die-to-wafer hybridization, this process enables downstream wafer level post-processing, i.e. substrate removal, coatings, and test, which can further reduce cycle time and cost.

Thus, using isostatic pressure, the force is applied uniformly, resulting in less force to achieve the same amount of cold inter-diffusion even at areas of low substrate thickness. Not only does utilizing an isostatic chamber have process throughput and cost savings, it also reduces the chance of damage to parts due to high thickness variation or particle contamination using a standard cold hybridization. Further, isostatic pressure reduces the flatness requirement to achieve efficient high force cold compression because, the use of a container having flexible walls (a deflectable membrane) applying force uniformly is much more forgiving of real world parts that have measurable warp and thickness variation.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 3A-3F are illustrations of steps in the process according to the disclosure

FIG. 7A being an isometric view; FIG. 7B being an exploded cross sectional view; and FIG. 7C being an assembled cross sectional view; such cross section being taken along line 7C-7C in FIG. 7A.

Like reference symbols in the various drawings indicate like elements.

DETAILED DESCRIPTION

Figure 1:
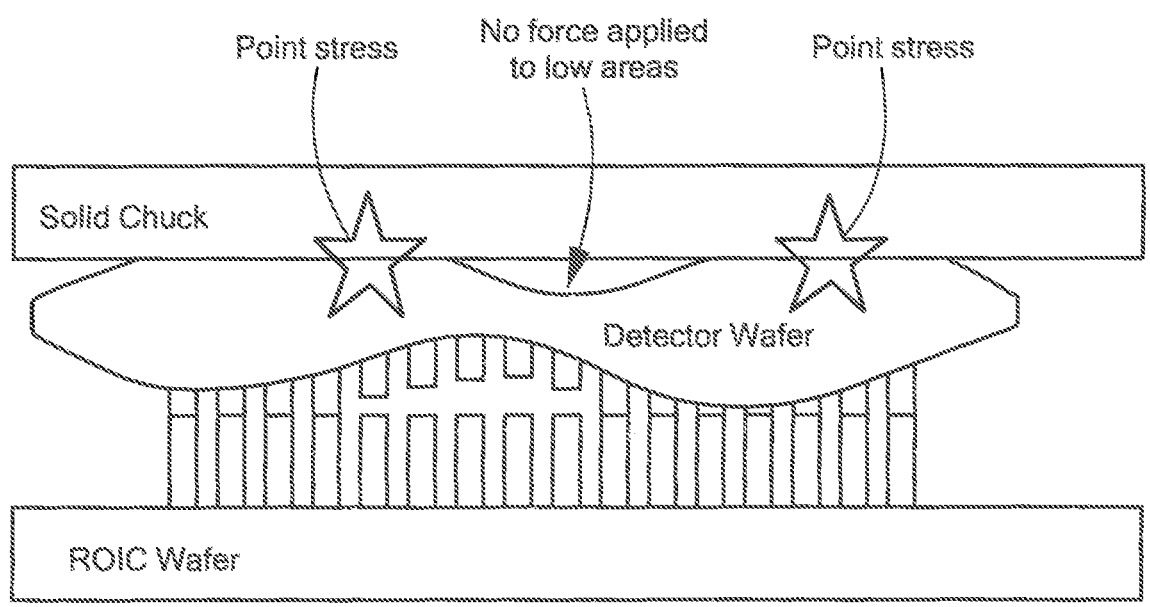
FIG. 1 is a diagrammatical sketch illustrating the effect of cold compression bonding used to attach a semiconductor wafer having a plurality of electromagnetic radiation detectors to a semiconductor wafer having read out integrated circuits according to the PRIOR ART.
Figure 2:
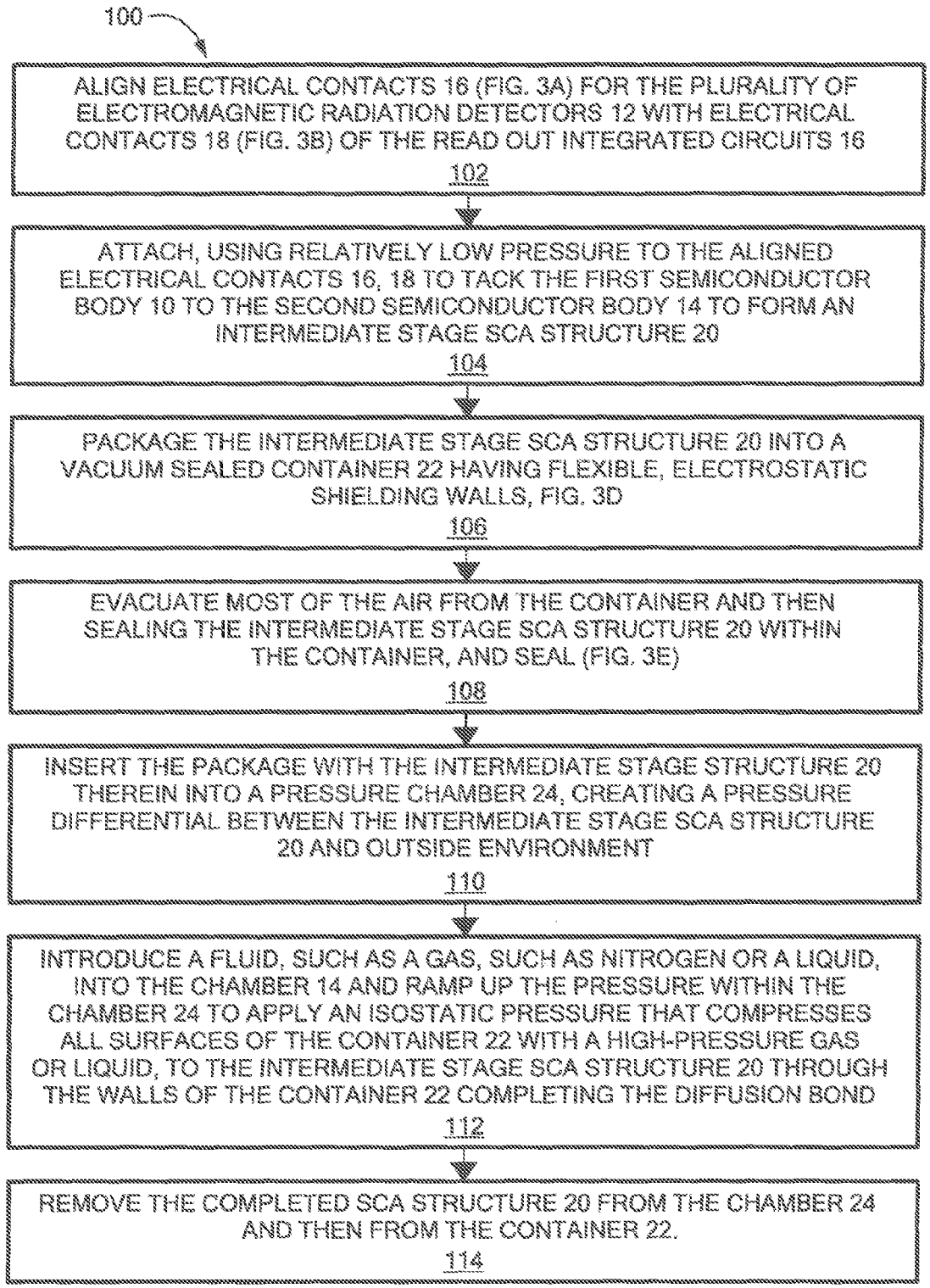
FIG. 2 is a flow diagram of a processes used to flip-chip bond a first semiconductor wafer having a plurality of electromagnetic radiation detectors to a second semiconductor wafer having read out integrated circuits for the detectors bond according to the disclosure.
Figure 3A:
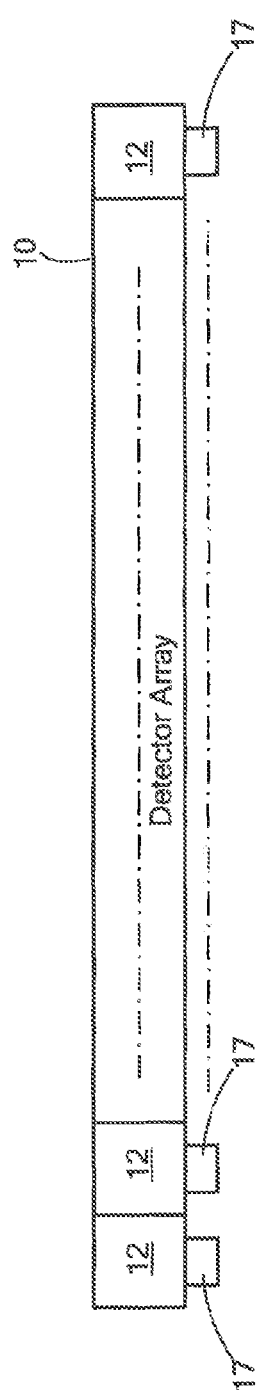
Figure 3B:
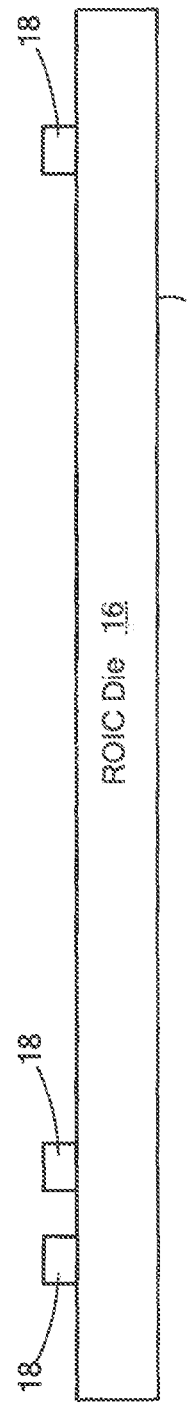
Figure 3C:
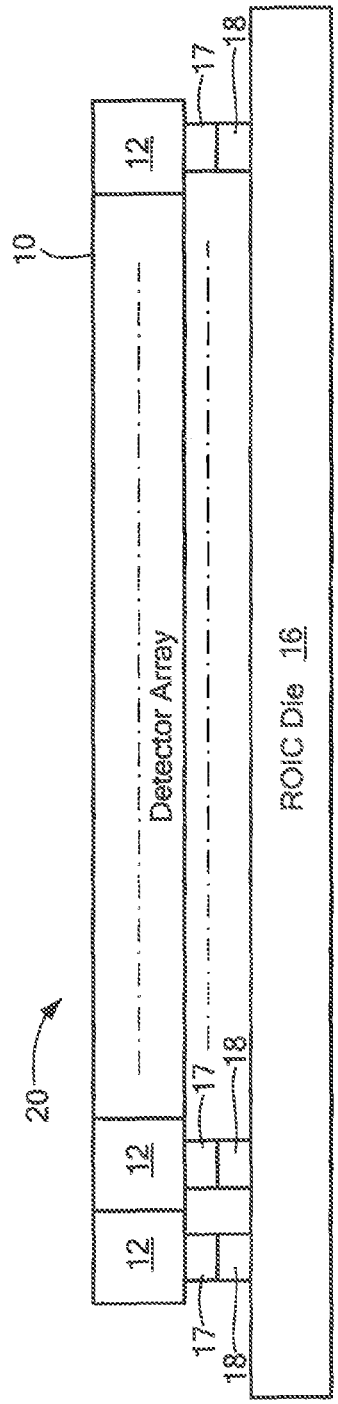
Figure 3F:
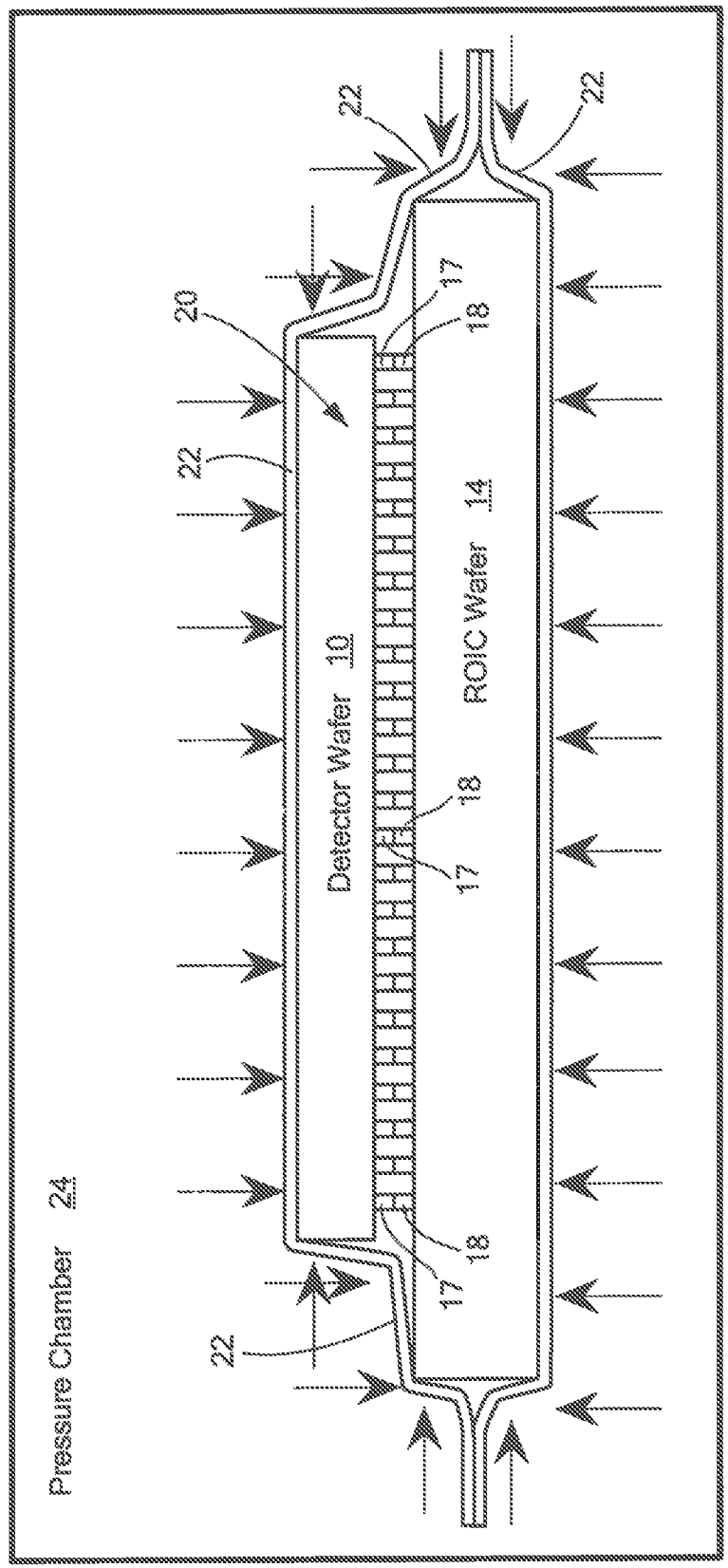

Referring now to FIG. 2, a flow diagram 100 of a process used to flip-chip bond a first semiconductor body 10, for example, indium antimonite or silicon (FIG. 3A) having a plurality of electromagnetic radiation detectors 12, here a single detector array die, to a second semiconductor body 14, for example, silicon, (FIG. 3B) having read out integrated circuits 16 for the detectors 12, here a single ROIC die. The process 100 includes: aligning electrical contacts 17 (FIG. 3A) for the plurality of electromagnetic radiation detectors 12 with electrical contacts 18 (FIG. 3B) of the read out integrated circuits 16 (Step 102), as shown; attaching, more particularly applying relatively low pressure to the aligned electrical contacts electrical contacts 17, 18 to tack the first semiconductor body 10 to the second semiconductor body 14 to form an intermediate stage structure or SCA 20 (e.g., a rapid compression (e.g. <10 minutes, compared to 1-2 hours), (Step 104), as shown in FIG. 3C; packaging the intermediate stage SCA structure 20 into a vacuum sealed container 22 having flexible, electrostatic shielding walls, FIG. 3D (Step 106), evacuating most of the air from the container and then sealing the intermediate stage SCA structure 20 within the container (Step 108) (FIG. 3E); inserting the package with the intermediate stage SCA structure 20 therein into a pressure chamber 24, creating a pressure differential between the intermediate stage SCA structure 20 and outside environment (Step 110); and introducing a fluid, such as a gas, such as nitrogen or a liquid, into the chamber 14 and ramping up the pressure within the chamber 24 to apply an isostatic pressure indicated by the arrows in FIG. 3F that compresses all surfaces of the container 22 with a high-pressure gas or liquid, to the intermediate stage SCA structure 20 through the walls of the container 22 completing the diffusion bond (Step 112); and removing the completed SCA structure 20 from the chamber 24 and then from the container 22 (step 114).

Figure 4A:
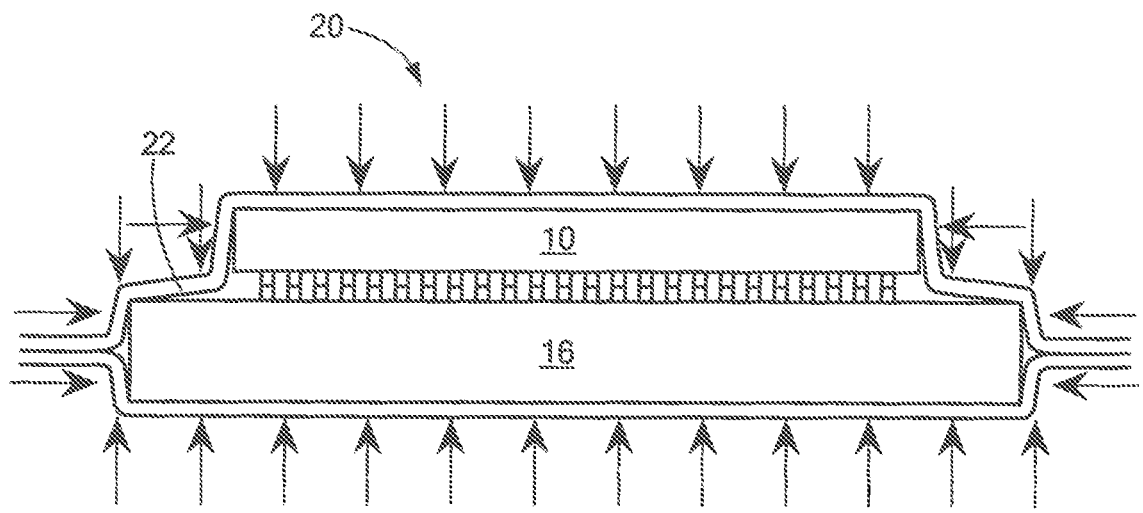
FIGS. 4A and 4B shows the isostatic pressure forces and without the use of a sealed container, respectively.
Figure 4B:
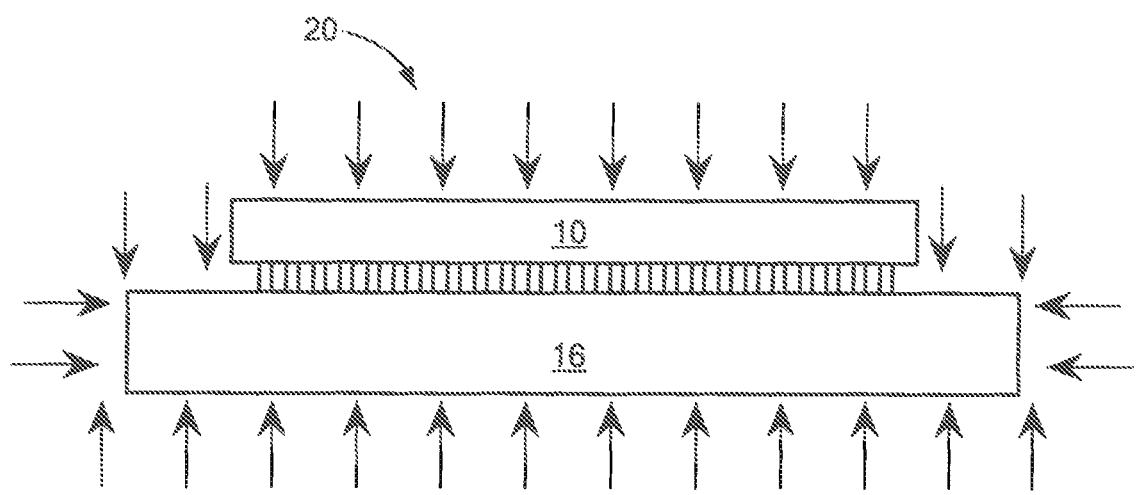

In order to compress the electrical contacts 17 (FIG. 3A) for the plurality of electromagnetic radiation detectors a pressure differential must be created. This is achieved by sealing the intermediate stage structure or SCA 20 in the vacuum sealed container 22. Absent such a vacuum sealed container 22, equal and opposite forces applied to all sides of the intermediate stage structure or SCA 20 would result in little or no relative net force on the contacts, as illustrated in comparing FIG. 4F with FIG. 4B; the arrows in FIG. 4A showing the isostatic pressure forces with a sealed container 22 and the arrows in FIG. 4B showing the forces without the sealed container.

Thus, in order to compress the electrical contacts for the plurality of electromagnetic radiation detectors with electrical contacts of the read out integrated circuits electrical contact, a pressure differential must be created. This is achieved by sealing intermediate stage structure in a vacuum sealer container. If the intermediate stage structure or SCA 20 was inserted in the isostatic pressure chamber without a vacuum sealed container, all surfaces (top and bottom of stage structure or SCA 20) would be compressed equally, negating any indium interface compression.

An example of this is when a balloon filled with air is submerged into deep water, causing it to shrink because the compressible gas inside the balloon reduces in volume, whereas if the balloon is filled with water, it will retain its shape and volume because the forces on the inside and outside of the balloon are equal. If the intermediate stage structure or SCA 20 in isostatic pressure chamber without a vacuum sealed container, all surfaces (top and bottom of intermediate stage structure or SCA 20) would be compressed equally, negating any indium interface compression.

Also, because these are electrical components, they are extremely sensitive to electro static damage, thus the use of ESD bags as the container 22 or sealing medium.

Figure 5A:
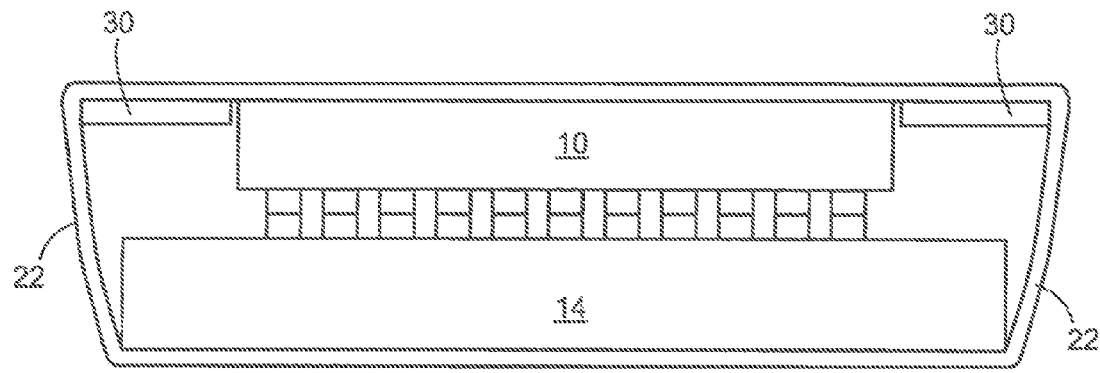
FIGS. 5A and 5B are diagrammatical sketches illustrating the effect of isostatic bonding used to attach a semiconductor body having a plurality of electromagnetic radiation detectors to a semiconductor body having read out integrated circuits according to the disclosure, with and without the use of a standoff, respectively.
Figure 5B:
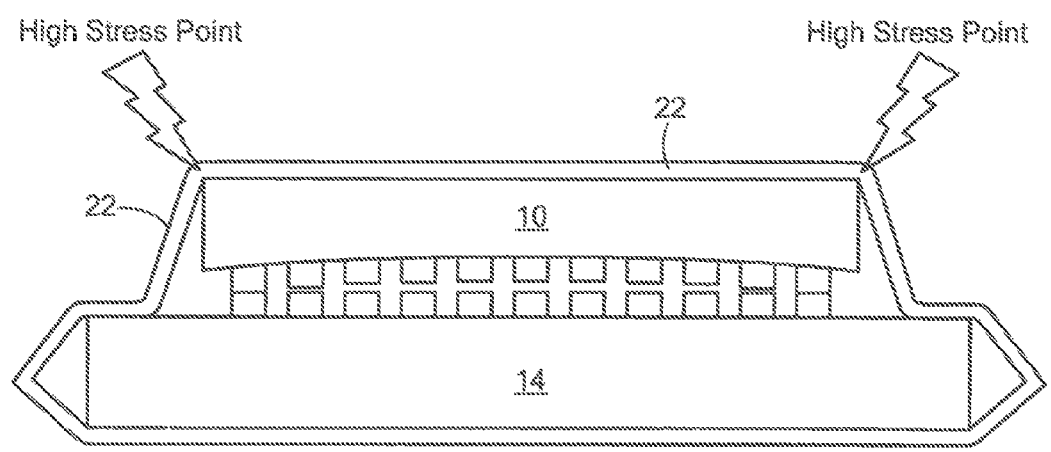

Referring now to FIG. 5A, here the container 22 includes a stand-off 30 to space walls of the container 22 from edges of the semiconductor bodies 10, 14 as shown. Thus, comparing FIG. 5B with FIG. 5A, it is noted that with FIG. 5A there may be stress points between the container 22 and corners of the die 10, 14, which causes the die 10 to buckle, as shown in FIG. 5B. The standoff 30 reduces these stress points, as illustrated in FIG. 5A.

Figure 6A:
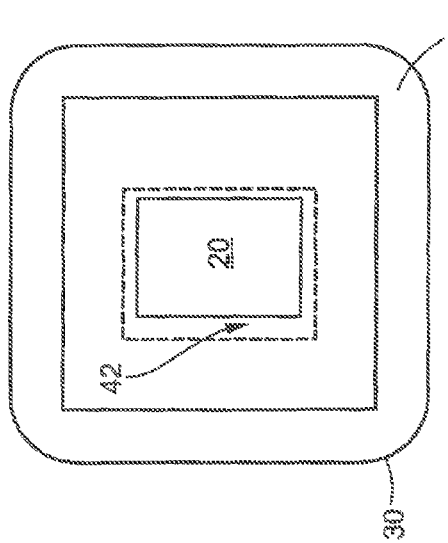
FIGS. 6A-6D illustrate a standoff for processing a detector die to a ROIC die according to the disclosure.
Figure 6B:
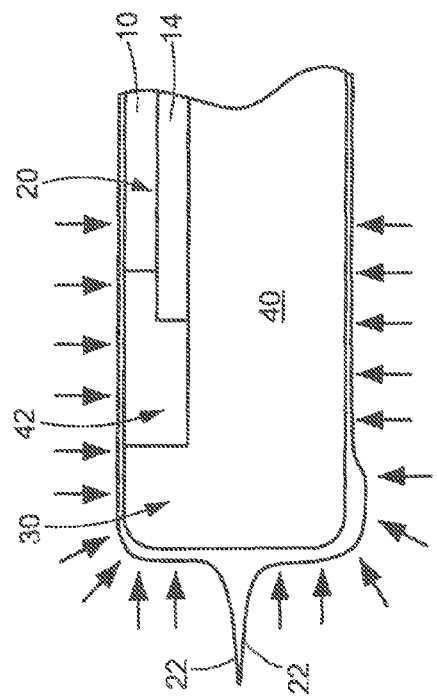
Figure 6C:
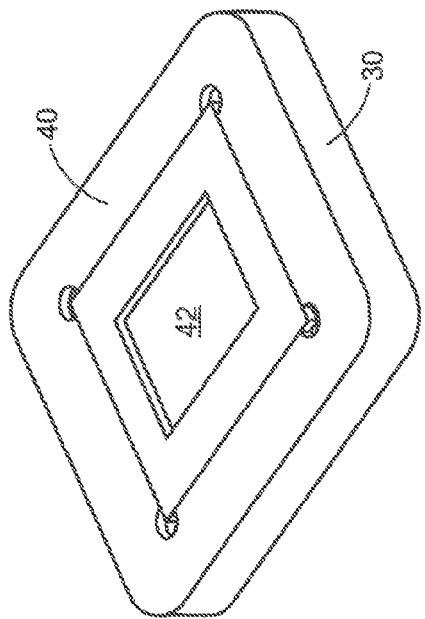
Figure 6D:
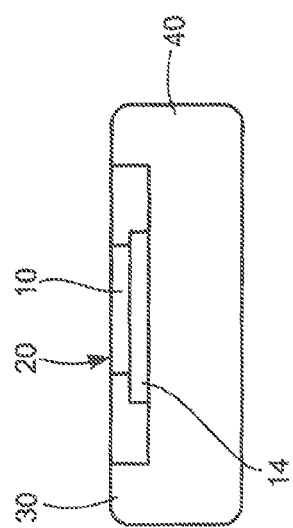

In one embodiment, a standoff has a frame 40 (FIG. 6A), with a slot 42 therein for one of the intermediate stage structure or SCA 20 (FIGS. 6B and 6C) with edges to provide the standoff 30. The frame 40 with the intermediate stage structure or SCA 20 is placed in the container 22, the container 22 is evacuated, and then placed in the pressure chamber 24 as described in FIG. 3F. The applied pressure is indicated by the arrows in FIG. 3D, it being noted that the standoff 30 provided by the frame 40 reduces the high stress points as described above in connection with FIGS. 5A and 5B.

Figure 7A:
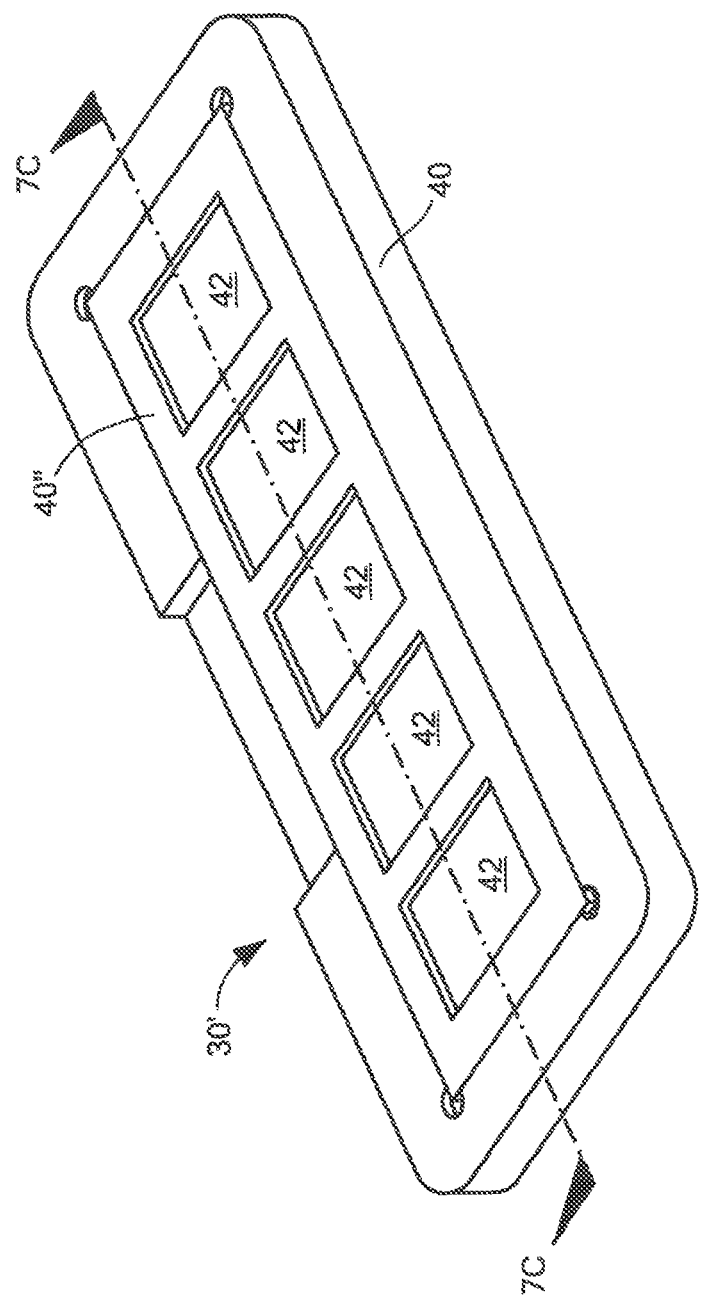
FIGS. 7A-7C illustrate a standoff for processing a plurality of detector die to a ROIC wafer according to another embodiment of the disclosure.
Figure 7B:
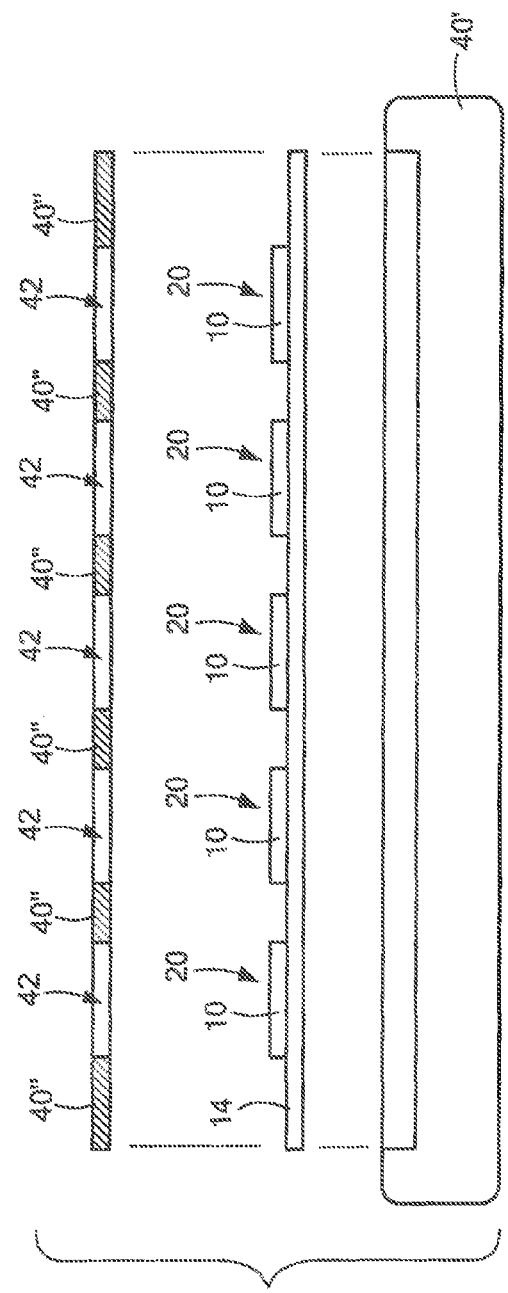
Figure 7C:
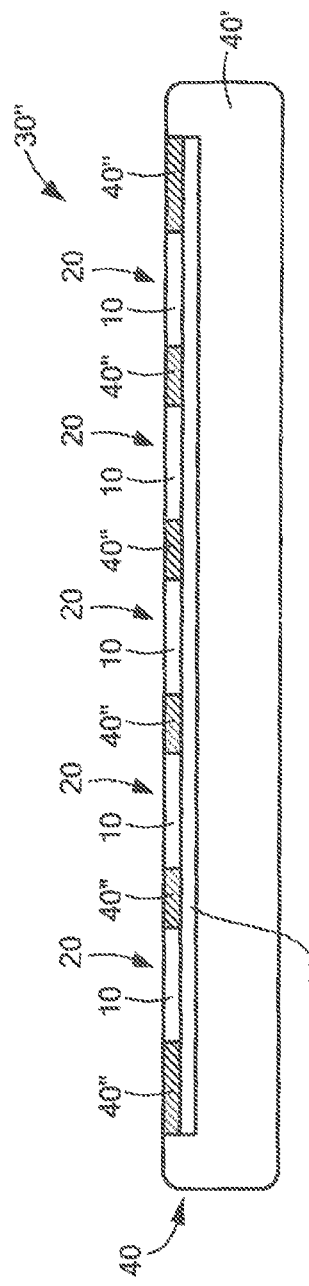

Referring now to FIGS. 7A-7C, here the stand off 30' has a tray or base 40' with a removable window-like frame 40" has a plurality of windows, slots or cut-outs 42, here for example, five windows 42, through the frame 40", one for each for a corresponding plurality of, here for example, five, single detector array die 10, each die 10 and is configured to receive on the bottom a single wafer 14. The edges (FIG. 7C) of the frame 40 provides the standoff 30. Here, however, the five array die 10 are simultaneously bonded to the single ROIC wafer 14. Here, the plurality of die in the isostatic press are compressed simultaneously, providing further cost/labor reduction, both at the hybridization operation and at later operations if populating a wafer.

Thus, described above, the process may be used to bond a single array detector die to a single ROIC die, or the process may be used to bond multiple detector die to an ROIC wafer.

It should be noted that because the isostatic pressure is applied uniformly over the surface the detector die, die exhibiting inconsistencies in flatness or Total Thickness Variation (TTV) respond better than with standard solid chuck compression. Further, isostatic pressure is more forgiving of part Flatness, TTV, and particle contamination. Solid chuck hybridization presses parts non-uniformly, applying pressure at high points or thicker sections of the hybrid stack. This results in areas where interconnect is not achieved until indium stack is sufficiently deformed to allow low areas (thinner substrate) the chance to achieve interconnect. Alternatively, using isostatic pressure, three is applied uniformly, resulting in less force to achieve the same amount of cold inter-diffusion even at areas of low substrate thickness. Not only does utilizing an isostatic chamber have process throughput and cost savings, it also reduces the chance of damage to parts due to high thickness variation or particle contamination using a standard cold hybridization.

A number of embodiments of the disclosure have been described. Nevertheless, it will be understood that various modifications may be made without departing from the spirit and scope of the disclosure. For example, the pressure chamber may have a temperature therein elevated above room temperature. Accordingly, other embodiments are within the scope of the following claims.

What is claimed is:

1. A method for bonding a first semiconductor body having a plurality of electromagnetic radiation detectors to a second semiconductor body having read out integrated circuits for the detectors, comprising:
   aligning the first and second semiconductor bodies one over the other to form an intermediate stage structure;
   packaging the intermediate stage structure into a container having flexible walls;
   inserting the package with the intermediate stage structure therein into a pressure chamber; and
   applying isostatic pressure to the intermediate stage structure through the walls of the container.

2. The method recited in claim 1 wherein the container provides electrostatic shielding to the intermediate stage structure.

3. The method recited in claim 1 wherein the container includes a stand-off to space walls of the container from edges of the first semiconductor body.

4. A method for bonding a first semiconductor body having a plurality of electromagnetic radiation detectors to a second semiconductor body having read out integrated circuits for the detectors, comprising:
   aligning electrical contacts for the plurality of electromagnetic radiation detectors with electrical contacts of the read out integrated circuits;
   attaching the aligned electrical contacts for the plurality of electromagnetic radiation detectors with electrical contacts of the read out integrated circuits to form an intermediate stage structure;
   packaging the intermediate stage structure into a vacuum sealed container having flexible walls;
   inserting the package with the intermediate stage structure therein into a pressure chamber;
   applying pressure in the chamber to the intermediate stage structure through the walls of the container.

5. The method recited in claim 4 wherein the pressure is an isostatic pressure.

6. The method recited in claim 4 wherein the container includes a stand-off to space walls of the container from edges of the first semiconductor body.

7. The method recited in claim 5 wherein the container provides electrostatic shielding to the intermediate stage structure.

8. The method recited in claim 7 wherein the container includes a stand-off to space walls of the container from edges of the first semiconductor body.

9. The method recited in claim 5 wherein the container includes a stand-off to space walls of the container from edges of the first semiconductor body.

10. The method recited in claim 6 wherein the container provides electrostatic shielding to the intermediate stage structure.

11. The method recited in claim 8 wherein the container includes a stand-off to space walls of the container from edges of the first semiconductor body.

12. A method for bonding a first semiconductor body having a plurality of electromagnetic radiation detectors to a second semiconductor body having read out integrated circuits for the detectors, comprising:
   aligning electrical contacts for the plurality of electromagnetic radiation detectors with electrical contacts of the read out integrated circuits;
   attaching the aligned electrical contacts for the plurality of electromagnetic radiation detectors with electrical contacts of the read out integrated circuits to form an intermediate stage structure;
   packaging the intermediate stage structure into a vacuum sealed container having flexible walls;
   inserting the package with the intermediate stage structure therein into a pressure chamber;
   introducing a fluid into the chamber to apply pressure to the intermediate stage structure through the walls of the container.

13. The method recited in claim 12 wherein the pressure is an isostatic pressure.

14. The method recited in claim 12 wherein the container includes a stand-off to space walls of the container from edges of the first semiconductor body.

15. The method recited in claim 13 wherein the container provides electrostatic shielding to the intermediate stage structure.

16. The method recited in claim 15 wherein the container includes a stand-off to space walls of the container from edges of the first semiconductor body.

17. The method recited in claim 13 wherein the container includes a stand-off to space walls of the container from edges of the first semiconductor body.

18. The method recited in claim 14 wherein the container provides electrostatic shielding to the intermediate stage structure.

19. The method recited in claim 16 wherein the container includes a stand-off to space walls of the container from edges of the first semiconductor body.

20. A method, comprising:
providing a semiconductor wafer,
simultaneously bonding a plurality of detector die to the semiconductor wafer, comprising:
aligning the semiconductor wafer and the plurality of detector die to form an intermediate stage structure;
packaging the intermediate stage structure into a container having flexible walls;
inserting the package with the intermediate stage structure therein into a pressure chamber; and
applying the isostatic pressure to the intermediate stage structure through the walls of the container.

21. The method recited in claim 20 wherein each one of the die includes a plurality of electromagnetic radiation detectors.

22. The method recited in claim 21 wherein the semiconductors wafer includes read out integrated circuits for the detectors.

23. The method recited in claim 20 wherein the simultaneously bonding comprises:
introducing a fluid into the chamber to apply pressure to the intermediate stage structure through the walls of the container.

24. The method recited in claim 23 wherein each one of the die includes a plurality of electromagnetic radiation detectors.

25. The method recited in claim 24 wherein the semiconductors wafer includes read out integrated circuits for the detectors.

26. The method recited in claim 22 wherein the container includes a stand-off to space walls of the container from edges of the semiconductor wafer.

27. The method recited in claim 22 wherein the container provides electrostatic shielding to the intermediate stage structure.

28. The method recited in claim 26 wherein the container includes a stand-off to space walls of the container from edges of the wafer.

29. The method recited in claim 28 wherein the stand-off includes a frame having a plurality of windows and wherein the aligning comprises placing each one of the die into a corresponding one of the windows.

* * * * *